US009041475B1

(12) United States Patent
Williams

(10) Patent No.: US 9,041,475 B1
(45) Date of Patent: May 26, 2015

(54) THERMALLY STABLE LOW POWER CHIP CLOCKING

(71) Applicant: Cambridge Silicon Radio Limited, Cambridge (GB)

(72) Inventor: Peter Andrew Rees Williams, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 14/141,730

(22) Filed: Dec. 27, 2013

(51) Int. Cl.
H03B 5/12 (2006.01)
H03L 5/00 (2006.01)

(52) U.S. Cl.
CPC ........................................ *H03L 5/00* (2013.01)

(58) Field of Classification Search
CPC .............. H03L 1/02; H03L 1/022; H03L 1/04
USPC ............................................................ 331/49
See application file for complete search history.

(56) References Cited

U.S. PATENT DOCUMENTS

| 5,200,714 | A  | * | 4/1993  | Hayashi ........................... 331/66 |
| 5,475,324 | A  | * | 12/1995 | Tomiyori ...................... 327/145 |
| 5,525,936 | A  | * | 6/1996  | Post et al. ........................ 331/47 |
| 6,806,698 | B2 | * | 10/2004 | Gauthier et al. ........... 324/76.41 |
| 6,814,485 | B2 | * | 11/2004 | Gauthier et al. .............. 374/170 |
| 6,828,869 | B2 | * | 12/2004 | Diewald ......................... 331/176 |
| 7,250,825 | B2 | * | 7/2007  | Wilson et al. ................... 331/44 |
| 7,421,251 | B2 | * | 9/2008  | Westwick et al. ............... 455/85 |
| 7,576,617 | B2 | * | 8/2009  | Itagaki et al. ................... 331/49 |
| 7,693,678 | B2 | * | 4/2010  | Cheng et al. ................... 702/130 |
| 7,728,684 | B2 | * | 6/2010  | Tozer ............................. 331/176 |
| 7,764,131 | B1 |   | 7/2010  | Seth et al. |
| 8,077,012 | B2 | * | 12/2011 | Batra et al. ................... 340/10.1 |
| 8,138,972 | B2 | * | 3/2012  | Underbrink et al. ..... 342/357.63 |
| 2012/0044000 | A1 |   | 2/2012 | Hsieh et al. |
| 2012/0250469 | A1 |   | 10/2012 | White et al. |

FOREIGN PATENT DOCUMENTS

WO    WO 2012/057862 A1    5/2012

OTHER PUBLICATIONS

GB Search Report issued in related GB Application No. 1414020.6, dated Feb. 11, 2015.

* cited by examiner

*Primary Examiner* — Thomas J Hiltunen
(74) *Attorney, Agent, or Firm* — RatnerPrestia

(57) ABSTRACT

A method of controlling an integrated circuit chip including first and second clock sources, the first clock source being more thermally stable and having a higher power consumption, the integrated circuit chip being operable in a first mode in which the first clock source is inactive and the second clock source active and in a second mode in which the first and second clock sources are active, the method including operating the integrated circuit chip in the first mode; taking a measurement indicative of temperature; if the measurement indicates that the temperature is outside of a temperature band: activating the first clock source so as to operate the integrated circuit chip in the second mode; recalibrating the second clock source against the first clock source; and following the recalibration, deactivating the first clock source so as to return the integrated circuit chip to the first mode.

17 Claims, 4 Drawing Sheets

THERMALLY STABLE LOW POWER CHIP CLOCKING

BACKGROUND

Electronic communications devices communicate with each other in accordance with radio communications protocols. One such radio communications protocol is the Bluetooth protocol. The Bluetooth protocol specifies different power modes in which an electronic communications device can operate. Minimum requirements for the operation of the device in each power mode are specified by the protocol. One of these requirements is that the operations of the device have to be clocked with a prescribed accuracy. In the case of the Bluetooth Specification v4.0, the active clock has to be accurate to 250 ppm (parts per million) in the low power "sleep" mode of operation.

Typically, one or more crystal oscillators are used to run the operation of a Bluetooth chip during an active mode, for example when the chip is transmitting or receiving Bluetooth signals. However, crystal oscillators are high frequency and have a high power consumption. Low power analogue oscillators are preferred for use in lower power modes of operation. They are lower frequency and have a much lower power consumption than crystal oscillators. However, low power oscillators are only thermally stable in a small window around room temperature. Outside this window, they exhibit poor temperature performance. Thus, they cannot support the required accuracy specified by the Bluetooth Specification v4.0 across the range of temperatures to which the devices they are incorporated into are routinely exposed.

One approach to satisfying the required clock accuracy in the low power sleep mode is to actively run both a crystal oscillator and a low power analogue oscillator. The low power analogue oscillator runs the operation of the chip, but is correlated against the crystal when needed. This ensures that the required clock accuracy can be guaranteed even across those temperature ranges where the low power oscillator in isolation exhibits poor thermal stability.

This approach solves the problem of providing the required clock accuracy. But the crystal oscillator has a high power consumption, and thus this solution increases the power consumption of the low power sleep mode. With increased market demand for lower power/longer battery life electronic devices, a lower power solution is needed.

SUMMARY OF THE INVENTION

According to a first aspect, there is provided a method of controlling an integrated circuit chip comprising a first clock source and a second clock source, the first clock source being more thermally stable and having a higher power consumption than the second clock source, the integrated circuit chip being operable in a first mode in which the first clock source is inactive and the second clock source is active and being operable in a second mode in which the first clock source is active and the second clock source is active, the method comprising: operating the integrated circuit chip in the first mode; taking a measurement indicative of temperature; if the measurement indicates that the temperature is outside of a temperature band: activating the first clock source so as to operate the integrated circuit chip in the second mode; recalibrating the second clock source against the first clock source; and following the recalibration, deactivating the first clock source so as to return the integrated circuit chip to the first mode.

Suitably, the second clock source comprises a transistor, and the measurement indicative of temperature is a measurement of voltage drop over the transistor.

Suitably, when operating the integrated circuit chip in the first mode, the method comprises periodically taking a measurement indicative of temperature; and only if a periodic measurement indicates that the temperature is outside of the temperature band, performing the activating, recalibrating and deactivating steps.

Suitably, each periodic measurement indicative of temperature is a measurement indicative of the change in absolute temperature since the last absolute temperature measurement.

Suitably, following recalibration the method comprises: taking a measurement indicative of temperature in the second mode; determining upper and lower bounds indicative of a maximum temperature and a minimum temperature of an updated temperature band; and for subsequent measurements indicative of temperature, if the measurement indicates that the temperature is outside of the updated temperature band, performing the activating, recalibrating and deactivating steps.

Suitably, the method comprises determining the upper and lower bounds in dependence on a predetermined profile of the error of the second clock source against temperature.

Suitably, the determined upper and lower bounds correspond to a predetermined maximum error of the second clock source.

Suitably, the integrated circuit chip operates in accordance with a radio protocol, and the predetermined maximum error of the second clock source is specified by that radio protocol. Suitably, the radio protocol is Bluetooth.

Suitably, the temperature indicated by the measurement taken in the second mode is encompassed within the maximum and minimum temperatures of the updated temperature band.

Suitably, prior to operating the integrated circuit chip in the first mode, the method comprises: operating the integrated circuit chip in the second mode; taking a temperature measurement in the second mode; and determining the interval between the periodic measurements indicative of temperature during the first mode based on the temperature measurement in the second mode.

Suitably, the method comprises determining the interval between the periodic measurements indicative of temperature in dependence on a predetermined profile of the error of the second clock source against temperature, such that the wider the temperature band which corresponds to a predetermined maximum error of the second clock source from the temperature measurement in the second mode, the larger the interval between the periodic measurements indicative of temperature.

According to a second aspect, there is provided an integrated circuit chip comprising: a first clock source and a second clock source, the first clock source being more thermally stable and having a higher power consumption than the second clock source, the integrated circuit chip operable in a first mode in which the first clock source is inactive and the second clock source is active and operable in a second mode in which the first clock source is active and the second clock source is active; a sensor configured to take a measurement indicative of temperature when the integrated circuit chip is operating in the first mode; a controller configured to, if the measurement indicates that the temperature is outside of a temperature band: activate the first clock source so as to operate the integrated circuit chip in the second mode; recalibrate the second clock source against the first clock source;

and following the recalibration, deactivate the first clock source so as to return the integrated circuit chip to the first mode.

Suitably, the first clock source is a crystal oscillator. Suitably, the second clock source is a low power oscillator.

Suitably, the sensor comprises a transistor, and the measurement indicative of temperature is a measurement of voltage drop over the transistor.

Suitably, the sensor is configured to periodically take measurements indicative of temperature, and the sensor is configured such that the interval between periodic measurements indicative of temperature is adjustable.

Suitably, a third clock source is configured to clock the sensor, and the sensor is configured to take a measurement indicative of temperature when clocked by the third clock source.

Suitably, a second sensor is configured to be operable in the second mode and inactive in the first mode, the second sensor configured to take a temperature measurement in the second mode.

BRIEF DESCRIPTION OF THE DRAWINGS

The present disclosure will now be described by way of example with reference to the accompanying drawings. In the drawings.

DETAILED DESCRIPTION

The following description is presented by way of example to enable any person skilled in the art to make and use the invention. The present invention is not limited to the examples described herein and various modifications to the disclosed examples will be readily apparent to those skilled in the art.

Figure 4:
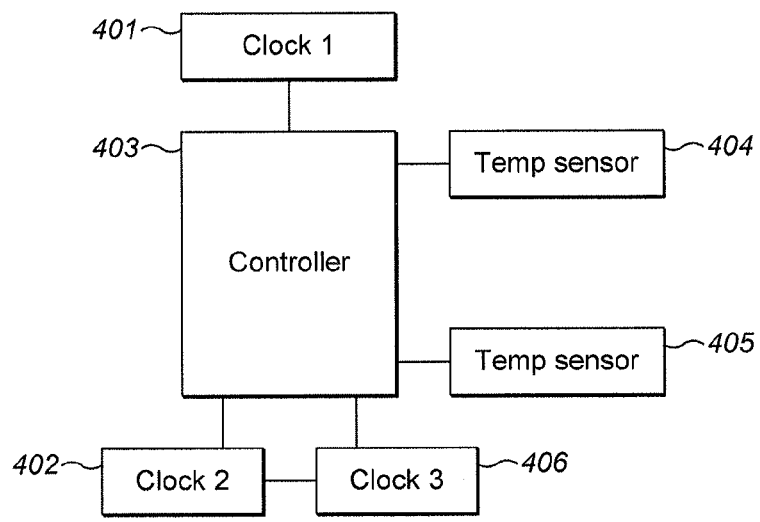
FIG. 4 illustrates clocking and control circuitry for implementing the methods illustrated in FIGS. 2 and 3.

FIG. 4 is a schematic diagram of exemplary clocking and control circuitry. This figure presents components of this circuitry in terms of functional blocks. Some functional blocks for carrying out functions well known in the art have in places been omitted from this figure.

Figure 2:
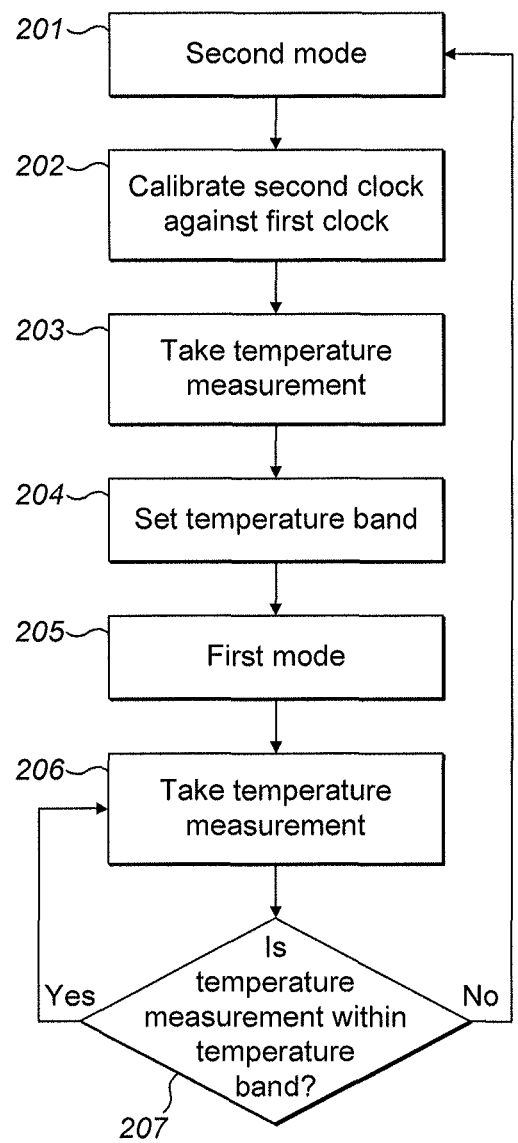
FIG. 2 is a flowchart of a method of maintaining clocking accuracy on an integrated circuit chip.
Figure 3:
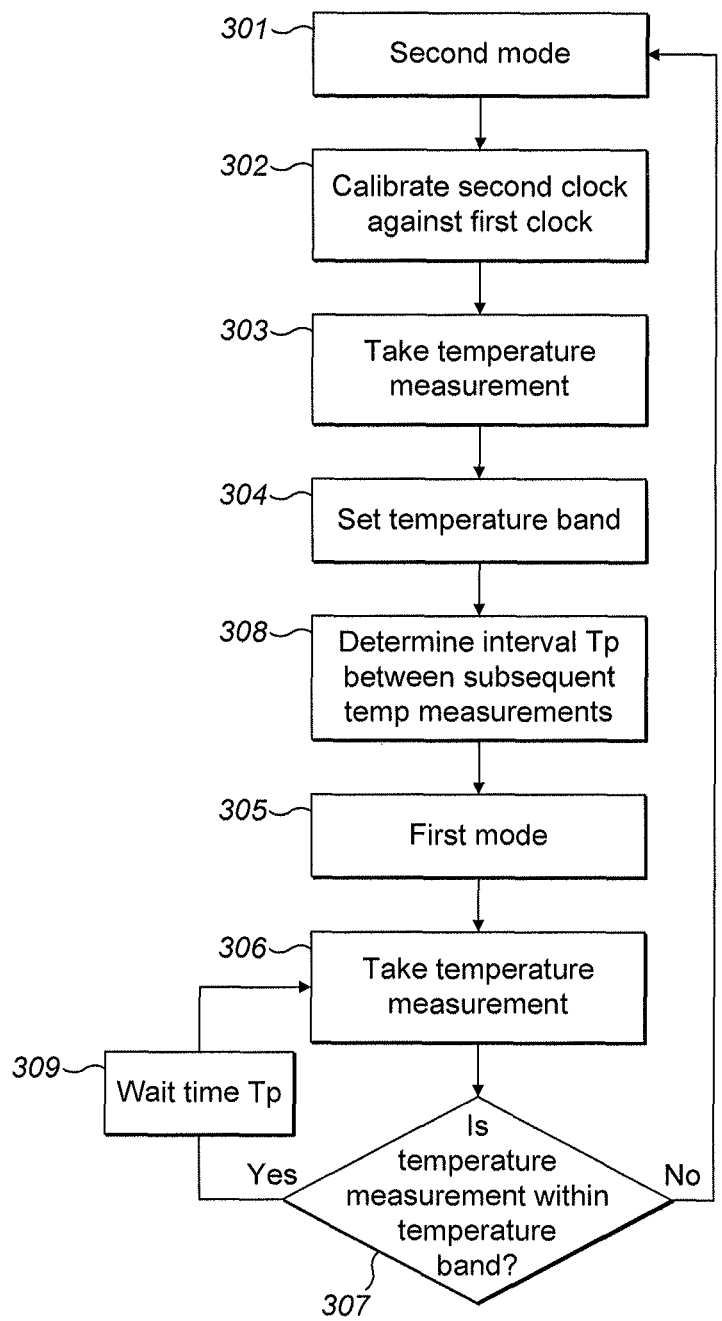
FIG. 3 is a flowchart of a further method of maintaining clocking accuracy on an integrated circuit chip.

FIGS. 2 and 3 are flowcharts illustrating methods of implementing clocking and control circuitry. Each flowchart depicts an order in which the method of that flowchart can be performed. However, the flowcharts are not intended to restrict the described methods to being implemented in the orders depicted. The steps of the methods may be carried out in alternative orders to those depicted in the flowcharts.

In the following examples, an integrated circuit chip is described which is operable in at least two modes. The first mode is a "sleep" mode, and the second mode is an "active" mode. The sleep mode is a low-power mode relative to the active mode. During the sleep mode, much of the on-chip circuitry is inactive and powered down. Minimal operations occur in this mode. During the active mode, much of the on-chip circuitry is active. For example, the chip transceiver circuitry may actively transmit and/or receive radio frequency signals during the active mode.

The integrated circuit chip has at least two clock sources. Suitably, the first clock source is a crystal oscillator. Typically, the crystal oscillator operates at a high frequency. For example, the crystal oscillator may operate at 16 MHz. Suitably, the second clock source is a low power oscillator (LPO). Typically, the low power oscillator operates at a low frequency. For example, the low power oscillator may operate at 32 kHz. The crystal oscillator produces a highly accurate and fast clock signal. Thus, the crystal oscillator is the primary clock source during the active mode of the integrated circuit chip. The LPO is also active during the active mode. The crystal oscillator consumes a lot of power therefore is not desirable for the sleep mode. For example, the crystal oscillator may consume 3 mA. Thus, suitably the crystal oscillator is not active during the sleep mode. The LPO is very low power, thus is preferred for the sleep mode in order to conserve battery power. For example, the LPO may consume 200 nA. The LPO has a low frequency, but this is acceptable during the sleep mode because few operations occur during this mode.

Suitably, the integrated circuit chip described herein operates according to a communications protocol. This communications protocol may specify a minimum accuracy of the clock source that is clocking the chip. This minimum accuracy may be different for different power modes of the chip. For example, the integrated circuit chip may operate in accordance with the Bluetooth protocol. The Bluetooth protocol specifies a minimum accuracy of the clock source that is clocking the device in the sleep mode. According to the Bluetooth Specification v4.0, this minimum accuracy is 250 ppm. In other words, the maximum error in the frequency output by the clock is 250 ppm.

Figure 1:
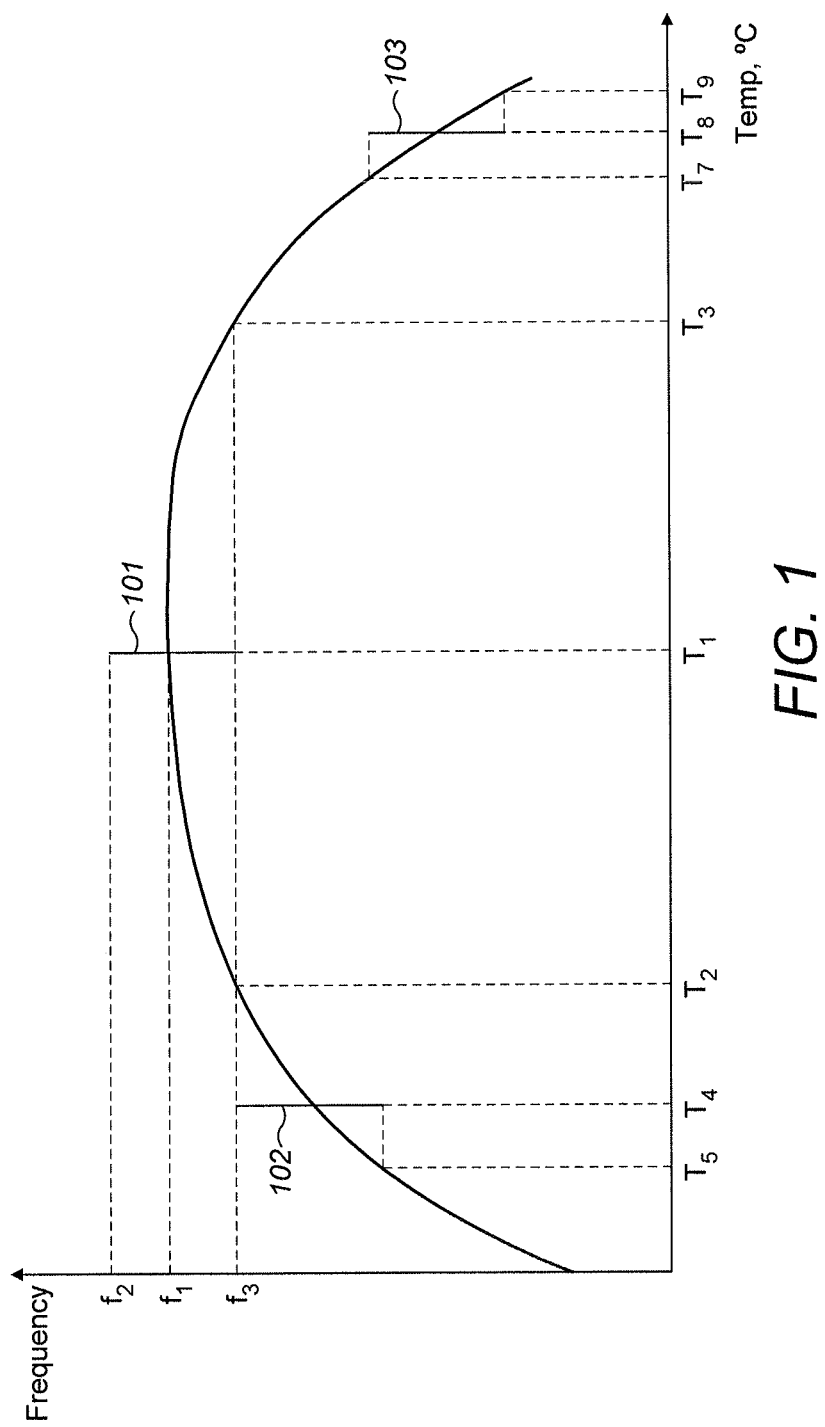
FIG. 1 illustrates an exemplary frequency profile with temperature of a low power oscillator.

FIG. 1 is an exemplary graph illustrating the consistency of the frequency produced by a LPO over temperature. The x-axis is temperature in degrees Celsius, and spans from approximately −30° C. to +85° C. The y-axis is frequency. The frequency outputted by the LPO varies with temperature. The temperature marked $T_1$ is approximately 20° C. Around $T_1$, the frequency profile is relatively flat. In other words, the frequency variation with temperature of the LPO is lowest at and around room temperature. At lower temperatures, for example below $T_2$, the frequency of the LPO becomes increasingly temperature dependent. The lower the temperature, the lower the frequency output by the LPO. A small reduction in temperature causes a large reduction in the frequency output by the LPO. At higher temperatures, for example above $T_3$, the frequency of the LPO becomes increasingly temperature dependent. The higher the temperature, the lower the frequency output by the LPO. A small increase in temperature causes a large decrease in the frequency output by the LPO. The temperatures at which the frequency of the LPO exhibits high temperature dependency include those at which the device that the LPO is incorporated into is likely to be exposed to. For example, taking the device outside on a chilly day could drop the temperature into the fast-varying portion of the graph below $T_2$. As another example, leaving the device in a car on a hot day could increase the temperature into the fast-varying portion of the graph above $T_3$. Thus, the LPO is not thermally stable over the range of temperatures to which the device it is incorporated into is routinely exposed.

By contrast, the crystal oscillator produces a clock frequency that is significantly more thermally stable across the range of temperatures to which the device that the crystal oscillator is incorporated into is routinely exposed. A corresponding graph to that illustrated in FIG. 1 for a crystal oscillator would be an almost flat line with a variation of only about 25 ppm over the range depicted in FIG. 1. In other words, the frequency output by the crystal oscillator does not vary much with temperature over the temperature range illustrated in FIG. 1.

Returning to FIG. 1, the frequency at temperature $T_1$ is $f_1$. The error bar 101 illustrates the maximum drift in the frequency that is allowed by the communications protocol. In other words, the LPO outputs a frequency of $f_1$ that needs to be accurate to, for example 250 ppm. If the output frequency is above $f_3$ but below $f_2$ then this is within the accuracy mandated by the communications protocol. But, if the output frequency is above $f_2$ or below $f_3$ then this is outside of the maximum error allowed by the communications protocol. It can be seen from the graph that if the temperature stays within $T_2$ to $T_3$, then the frequency output by the LPO will remain inside the error bar 101. But, if the temperature drops below $T_2$ or above $T_3$ then the frequency output by the LPO will drop below $f_3$ which is the lower bound of the error bar 101. Thus, in this case the accuracy required by the protocol would not be adhered to.

The range of temperatures corresponding to the acceptable frequency error bar is referred to herein as a temperature band. So, for example the temperature band at $T_1$ corresponding to error bar 101 is $T_2$ to $T_3$. This temperature band varies depending on the initial temperature. When the initial temperature is room temperature, the respective temperature band is wide. For example, at an initial temperature of 20° C., the temperature band may have a width of 20° C. from 10° C. to 30° C. When the initial temperature is low, the respective temperature band is narrow. For example, FIG. 1 illustrates error bar 102 for an initial temperature of $T_4$. Error bar 102 is the same size as error bar 101. However, because of the higher temperature dependence at low temperatures, the corresponding temperature band $T_5$ to $T_2$ is narrow. For example, at an initial temperature of −10° C., the temperature band may have a width of 5° C. from −12° C. to −7° C. When the initial temperature is high, the respective temperature band is narrow. For example, FIG. 1 illustrates error bar 103 for an initial temperature of $T_6$. Error bar 103 is the same size as error bar 101. However, because of the higher temperature dependence at high temperatures, the corresponding temperature band $T_7$ to $T_8$ is narrow.

FIG. 2 is an exemplary flowchart which illustrates a method of controlling the clocking of the integrated circuit chip so that the prescribed clocking accuracy of the communications protocol is adhered to. The following description refers to two clock sources. Suitably, the first clock source is a crystal oscillator as described above. Suitably, the second clock source is a LPO as described above. However, the method applies to any two clock sources, where the first clock source is more thermally stable and higher power than the second clock source. The following description refers to two modes: a first mode and a second mode. Suitably, the first mode is the sleep mode described above. Suitably, the second mode is the active mode described above. However, the first and second modes may correspond to other power modes, as long as the first mode is a lower power mode than the second mode. In the second mode, both the clock sources are active, whereas in the first mode only the second clock source is active.

Initially, at step 201, the integrated circuit chip is in the second mode. In this mode, both the first clock source and the second clock source are active. At step 202, the second clock source is calibrated against the first clock source. Suitably, this calibration occurs just prior to entering the first mode. This is so that the error of the clocking of the second clock source is minimised on entry into the first mode. At step 203 a temperature measurement is taken. Suitably, a temperature sensor takes the temperature measurement. Suitably, this temperature sensor is operable in the second mode, but not operable in the first mode. The temperature sensor is not operable in the first mode in order to save power.

At step 204 a temperature band is determined. This temperature band is determined in dependence on the temperature measurement taken at step 203. This temperature band is also determined in dependence on the accuracy mandated by the communications protocol.

The temperature band is also determined in dependence on the known relationship of frequency against temperature of the second clock source. The known relationship of frequency against temperature of the second clock source specifies a frequency $F_x$ at the measured temperature $T_x$. The maximum error $\Delta f$ in frequency mandated by the protocol gives a frequency range $F_x - \Delta f$ to $F_x + \Delta f$. The temperatures corresponding to $F_x - \Delta f$ and $F_x + \Delta f$ according to the known relationship of frequency against temperature are the bounds of the temperature band.

Taking FIG. 1 as an example, if the measured temperature at step 203 is $T_1$ and the error bar 101 is the maximum error allowed by the protocol, then the frequency range is $f_3$ to $f_2$. $f_2$ does not correspond to a temperature on the frequency profile of FIG. 1. $f_3$ corresponds to two temperatures: $T_2$ and $T_3$. Thus, the temperature band is $T_2$ to $T_3$.

At step 205 the chip enters the first mode. Thus, the first clock source is deactivated. At step 206, the chip takes a temperature measurement. The temperature measurement may be implemented using a discrete sampler to discretely sample the temperature. Alternatively, the temperature measurement may be implemented using a continuous comparator to monitor a change in temperature. Suitably, a temperature sensor takes the temperature measurement. This temperature sensor may be different to the temperature sensor that took the temperature measurement at step 203. At step 207, it is determined whether the temperature measurement taken at step 206 is within the temperature band determined at step 204. If the temperature measurement is within the temperature band, then the method proceeds to step 206 where another temperature measurement is taken. If the temperature measurement is not within the temperature band, then the method proceeds to step 201. In other words, the chip leaves the first mode and enters the second mode. This involves re-activating the first clock source. The second clock source is then recalibrated against the first clock source at step 202.

In other words, when in the first mode, successive temperature measurements are taken until a measured temperature lies outside of the determined temperature band. At this point, the first clock source is reactivated, and the second clock source is recalibrated against the first clock source. This ensures that the error of the second clock source is reduced to within the maximum limit prescribed by the protocol for the first mode. Whilst in the higher power second mode, a temperature measurement is taken, and a new temperature band determined. The chip then re-enters the lower power first mode. Temperature measurements are once again taken in the first mode until a temperature measurement is determined to be outside the new temperature band, which causes the second clock source to be recalibrated again.

The chip may exit the lower power first mode for a reason other than a temperature measurement lying outside the temperature band. For example, the chip may exit the lower power first mode in order to perform an operation such as transmitting a signal.

Suitably, step 203 of FIG. 2 is performed after step 204. For example, step 203 may be performed between steps 204 and 205. Alternatively, step 203 may be performed between steps 204 and 205.

Suitably, a more accurate temperature measurement is taken at step 203 than at step 206. This is because, suitably, a higher power, more accurate temperature sensor is used in the second mode at step 203 than in the first mode at step 206.

The method described with respect to FIG. 2 recalibrates the second clock source on the fly in dependence on the temperature and the temperature change. If the chip is at room temperature and/or the temperature is not varying much, then the time between successive recalibrations of the second clock source is high. However, if the chip is in a very cold or very hot location and/or the temperature is varying a lot, then the time between successive recalibrations of the second clock source is low. Thus, this method tailors the recalibration to the ambient temperature conditions. This is power saving compared to a method which has the first clock source constantly active in the first mode. It is also power saving compared to a method which recalibrates the second clock source at a regular interval, because that interval is short to allow for the worst case scenario of extreme temperatures varying quickly.

FIG. 3 is another exemplary flowchart which illustrates a method of controlling the clocking of the integrated circuit chip so that the prescribed clocking accuracy of the communications protocol is adhered to. Steps 301, 302, 303 and 304 are the same as respective steps 201, 202, 203 and 204 described with reference to FIG. 2.

At step 308, the interval $T_p$ between the temperature measurements to be taken in the first mode is determined. This interval is determined in dependence on the temperature measurement in the second mode taken at step 303. This interval is also determined in dependence on the accuracy mandated by the communications protocol. This interval is also determined in dependence on the known relationship of frequency against temperature of the second clock source. The interval $T_p$ may also be determined in dependence on the thermal inertia of the product into which the clocking and control circuitry is integrated. The interval $T_p$ is determined such that the wider the temperature band determined in step 304, the longer the interval $T_p$. Similarly, the narrower the temperature band determined in step 304, the shorter the interval $T_p$.

At step 305 the chip enters the first mode. Thus, the first clock source is deactivated. At step 306, the chip takes a temperature measurement as described with respect to step 206 of FIG. 2. At step 307, it is determined whether the temperature measurement taken at step 306 is within the temperature band determined at step 304. If the temperature measurement is within the temperature band, then the method proceeds to step 309, where an interval of $T_p$ as determined at step 308 lapses before proceeding to step 306 to take a further temperature measurement. If, at step 307, the temperature measurement is not within the temperature band, then the method proceeds to step 301 in the same manner described with reference to FIG. 2. In other words, the chip leaves the first mode and enters the second mode. This involves re-activating the first clock source. The second clock source is then recalibrated against the first clock source at step 302.

If the temperature band determined at step 304 is wide, then a big shift in ambient temperature is needed to cause the measured temperature at step 306 to lie outside of the temperature band. Such a big shift, for example the device being taken from inside to outside on a cold day, is unlikely to happen quickly. Thus, the temperature measurements during the first mode can be taken less frequently. For example, the interval $T_p$ may be 5 seconds. Conversely, if the temperature band determined at step 304 is narrow, then only a relatively small shift in ambient temperature is needed to cause the measured temperature at step 306 to lie outside of the temperature band. Such a small shift may not require the device to be moved, for example a small shift in the temperature in a room may be sufficient. In other words, such a small shift may happen quickly. Thus, the temperature measurements during the first mode are taken more frequently to ensure compliance with the clock accuracy required by the protocol. Thus, this method tailors the interval between measurements during the first mode to the ambient temperature conditions. This is power saving compared to the method of FIG. 2 which takes temperature measurements during the first mode at equal intervals. These intervals may be, for example, 500 ms. This is because the interval selected for the method of FIG. 2 is sufficiently short to allow for the worst case scenario of extreme temperatures varying quickly. Thus overall, more temperature measurements are made for the method of FIG. 2 than the method of FIG. 3, thus the method of FIG. 3 performs fewer operations and hence consumes less power.

FIG. 4 illustrates the general arrangement of clocking and control circuitry suitable for performing the methods described herein. The first clock source 401 is coupled to controller 403. The second clock source 402 is coupled to controller 403. Controller 403 controls the operations of the first clock source and the second clock source. For example, the controller 403 controls the activation and deactivation of the first clock source 401. Controller 403 also controls the calibration of the second clock source 402 by the first clock source 401. Controller 403 is suitably a digital controller.

FIG. 4 illustrates two temperature sensors 404 and 405. Temperature sensor 404 takes temperature measurements in the second mode. Temperature sensor 404 is connected to the controller 403. Controller 403 is clocked by the first clock source 401 to control the temperature sensor 404 to take a temperature measurement. Temperature sensor 405 takes temperature measurements in the first mode. Controller 403 is coupled to the second clock source 402 via a third clock source 406. Controller 403 is clocked by the third clock source 406 to control the temperature sensor 405 to take a temperature measurement. When implementing the method of FIG. 3, the third clock source 406 clocks the controller 403 at the interval $T_p$.

Temperature sensor 404 is a more accurate temperature sensor than temperature sensor 405. However, temperature sensor 404 consumes more power than temperature sensor 405. Since the temperature measurement taken by temperature sensor 404 in the second mode is used to determine the temperature band, a more accurate temperature reading is used than the temperature reading taken in the first mode.

Figure 5:
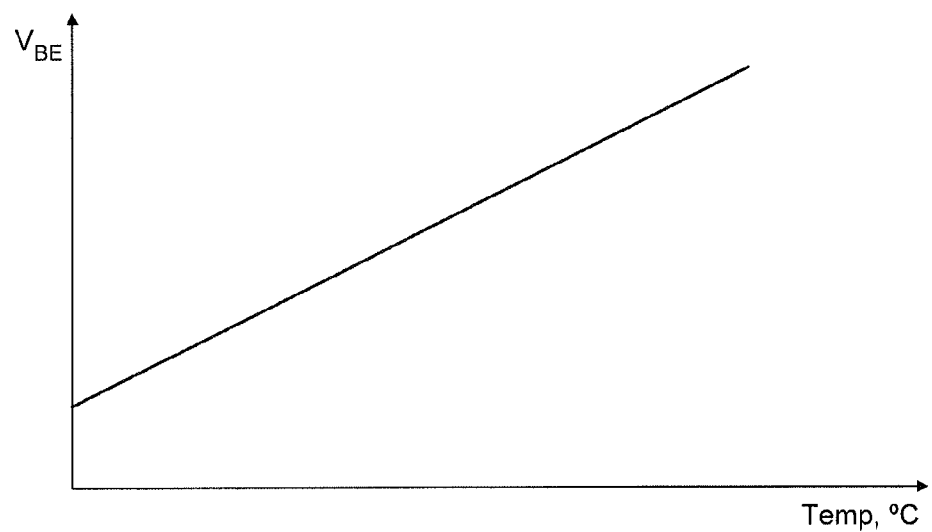
FIG. 5 is a graph illustrating the relationship between the voltage drop over a transistor and temperature.

Suitably, a low power method is used to take the temperature measurements in the first mode. One such method is to measure the voltage drop between the base and emitter of a transistor $V_{BE}$. FIG. 5 illustrates the relationship between the voltage drop $V_{BE}$ and temperature. As can be seen from the graph, $V_{BE}$ is directly proportional to the temperature. Thus, a measurement of $V_{BE}$ is indicative of temperature. Suitably, temperature sensor 405 is implemented by measuring $V_{BE}$ of a transistor incorporated in the clocking and control circuitry.

This method of implementing temperature sensor 405 is a very low power way to get an approximate temperature measurement. It is not as accurate as a more customary temperature sensor of the sort suitably used to implement temperature sensor 404. Suitably, the temperature sensor 405 detects the temperature change since the last absolute temperature measurement at step 203/303. This is because the voltage drop over a transistor provides a more accurate measure of the temperature change since the last absolute temperature measurement than it does of the absolute temperature. For example, a temperature change of 2° C. is detectable using this method. This temperature change measurement is indicative of the ambient temperature. For each temperature measurement taken at step 206/306 after the first mode has been entered, the ambient temperature is equal to the absolute temperature measured at step 203/303 plus the temperature change detected at step 206/306.

Suitably, the temperature band is determined at step 204/304 by determining upper and lower bounds of $V_{BE}$. These upper and lower bounds are indicative of the maximum and minimum temperatures of the temperature band because of the directly proportional relationship between $V_{BE}$ and temperature illustrated in FIG. 5.

The described clocking and control circuitry is suitably incorporated within a computing-based device. The computing-based device may be an electronic device. Suitably, the computing-based device comprises one or more processors for processing computer executable instructions to control operation of digital control circuitry 403 to control implementation of the methods described herein. The computer executable instructions can be provided using any computer-readable media such as a memory. Further software can be provided at the computing-based device to implement the methods described herein. The methods described herein may be performed by software in machine readable form on a tangible storage medium.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method of controlling an integrated circuit chip comprising a first clock source and a second clock source, the first clock source being more thermally stable and having a higher power consumption than the second clock source, the integrated circuit chip being operable in a first mode in which the first clock source is inactive and the second clock source is active and being operable in a second mode in which the first clock source is active and the second clock source is active, the method comprising:
 operating the integrated circuit chip in the first mode;
 periodically taking a measurement indicative of temperature;
 only if the measurement indicates that the temperature is outside of a temperature band:
  activating the first clock source so as to operate the integrated circuit chip in the second mode;
  recalibrating the second clock source against the first clock source; and
  following the recalibration:
   taking a measurement indicative of temperature in the second mode;
   determining upper and lower bounds indicative of a maximum temperature and a minimum temperature of an updated temperature band; and
   deactivating the first clock source so as to return the integrated circuit chip to the first mode,
 wherein for subsequent measurements indicative of temperature in the first mode, if the measurement indicates that the temperature is outside of the updated temperature band, performing the activating, recalibrating and deactivating steps.

2. A method as claimed in claim 1, wherein the second clock source comprises a transistor, and wherein the measurement indicative of temperature is a measurement of voltage drop over the transistor.

3. A method as claimed in claim 1, wherein each periodic measurement indicative of temperature is a measurement indicative of the change in absolute temperature since the last absolute temperature measurement.

4. A method as claimed in claim 1, comprising determining the upper and lower bounds in dependence on a predetermined profile of the error of the second clock source against temperature.

5. A method as claimed in claim 4, comprising determining the upper and lower bounds to correspond to a predetermined maximum error of the second clock source.

6. A method as claimed in claim 5, wherein the integrated circuit chip operates in accordance with a radio protocol, and the predetermined maximum error of the second clock source is specified by that radio protocol.

7. A method as claimed in claim 6, wherein the radio protocol is Bluetooth.

8. A method as claimed in claim 1, wherein the temperature indicated by the measurement taken in the second mode is encompassed within the maximum and minimum temperatures of the updated temperature band.

9. A method as claimed in claim 1, comprising prior to operating the integrated circuit chip in the first mode:
 operating the integrated circuit chip in the second mode;
 taking a temperature measurement in the second mode; and
 determining the interval between the periodic measurements indicative of temperature during the first mode based on the temperature measurement in the second mode.

10. A method as claimed in claim 9, comprising determining the interval between the periodic measurements indicative of temperature in dependence on a predetermined profile of the error of the second clock source against temperature, such that the wider the temperature band which corresponds to a predetermined maximum error of the second clock source from the temperature measurement in the second mode, the larger the interval between the periodic measurements indicative of temperature.

11. An integrated circuit chip comprising:
 a first clock source and a second clock source, the first clock source being more thermally stable and having a higher power consumption than the second clock source, the integrated circuit chip operable in a first mode in which the first clock source is inactive and the second clock source is active and operable in a second mode in which the first clock source is active and the second clock source is active;
 a sensor configured to periodically take measurements indicative of temperature when the integrated circuit chip is operating in the first mode, wherein the sensor is configured such that the interval between periodic measurements indicative of temperature is adjustable;
 a controller configured to, if the measurement indicates that the temperature is outside of a temperature band:
  activate the first clock source so as to operate the integrated circuit chip in the second mode;

recalibrate the second clock source against the first clock source; and following the recalibration, deactivate the first clock source so as to return the integrated circuit chip to the first mode.

12. An integrated circuit chip as claimed in claim 11, wherein the first clock source is a crystal oscillator.

13. An integrated circuit chip as claimed in claim 11, wherein the second clock source is a low power oscillator.

14. An integrated circuit chip as claimed in claim 11, wherein the sensor comprises a transistor, and wherein the measurement indicative of temperature is a measurement of voltage drop over the transistor.

15. An integrated circuit chip as claimed in claim 11, further comprising a third clock source configured to clock the sensor, wherein the sensor is configured to take a measurement indicative of temperature when clocked by the third clock source.

16. An integrated circuit chip as claimed in claim 11, configured to operate in accordance with the Bluetooth protocol.

17. An integrated circuit chip comprising:
a first clock source and a second clock source, the first clock source being more thermally stable and having a higher power consumption than the second clock source, the integrated circuit chip operable in a first mode in which the first clock source is inactive and the second clock source is active and operable in a second mode in which the first clock source is active and the second clock source is active;

a sensor configured to take a measurement indicative of temperature when the integrated circuit chip is operating in the first mode;

a controller configured to, if the measurement indicates that the temperature is outside of a temperature band:
  activate the first clock source so as to operate the integrated circuit chip in the second mode;
  recalibrate the second clock source against the first clock source; and
  following the recalibration, deactivate the first clock source so as to return the integrated circuit chip to the first mode;

wherein the integrated circuit chip further comprises a second sensor is configured to be operable in the second mode and inactive in the first mode, the second sensor configured to take a temperature measurement in the second mode.

* * * * *

UNITED STATES PATENT AND TRADEMARK OFFICE
CERTIFICATE OF CORRECTION

| | | |
|---|---|---|
| PATENT NO. | : 9,041,475 B1 | Page 1 of 1 |
| APPLICATION NO. | : 14/141730 | |
| DATED | : May 26, 2015 | |
| INVENTOR(S) | : Williams | |

It is certified that error appears in the above-identified patent and that said Letters Patent is hereby corrected as shown below:

On the Title Page, in Item (57), under "ABSTRACT", in Column 2, Line 6, delete "active" and insert -- is active --, therefor.

In the Specification

In Column 6, Lines 11-21, delete "The........... band." and insert the same at Line 10, after "protocol." as a continuation paragraph.

In the Claims

In Column 12, Line 20, in Claim 17, delete "sensor is" and insert -- sensor --, therefor.

Signed and Sealed this
Twenty-fourth Day of November, 2015

Michelle K. Lee
*Director of the United States Patent and Trademark Office*